(12) United States Patent
Ohkubo et al.

(10) Patent No.: US 8,049,583 B2
(45) Date of Patent: Nov. 1, 2011

(54) ACOUSTIC WAVE FILTER COMPRISING A REFLECTOR HAVING AN OBLIQUE SLIT

(75) Inventors: Kouta Ohkubo, Yokohama (JP); Yasufumi Kaneda, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 323 days.

(21) Appl. No.: 12/397,719

(22) Filed: Mar. 4, 2009

(65) Prior Publication Data

US 2009/0224854 A1 Sep. 10, 2009

(30) Foreign Application Priority Data

Mar. 10, 2008 (JP) .................................. 2008-059813

(51) Int. Cl.
  *H03H 9/64* (2006.01)
  *H03H 9/25* (2006.01)
(52) U.S. Cl. ..................................... 333/195; 310/313 D
(58) Field of Classification Search .......... 333/193–196; 310/313 B, 313 D
See application file for complete search history.

(56) References Cited

U.S. PATENT DOCUMENTS

| 3,970,970 | A | * | 7/1976 | Worley | 333/195 |
| 4,267,534 | A | * | 5/1981 | Tanski | 333/153 |
| 4,340,834 | A | * | 7/1982 | Sato | 310/313 D |
| 4,623,855 | A | | 11/1986 | Bulst | |
| 4,760,360 | A | * | 7/1988 | Grassl et al. | 333/195 |
| 5,621,364 | A | * | 4/1997 | Ruile et al. | 333/195 |
| 6,900,577 | B2 | * | 5/2005 | Takamine | 310/313 D |
| 7,012,480 | B2 | * | 3/2006 | Nakamura et al. | 333/133 |
| 2004/0169568 | A1 | | 9/2004 | Yip et al. | |
| 2006/0214748 | A1 | * | 9/2006 | Funami et al. | 333/195 |

FOREIGN PATENT DOCUMENTS

| JP | 59-207719 A | | 11/1984 |
| JP | 62-202610 | * | 9/1987 |
| JP | 07-131291 A | | 5/1995 |
| JP | 7-240658 | * | 9/1995 |
| JP | 10-261935 A | | 9/1998 |
| JP | 11-168350 | * | 6/1999 |
| JP | 2000-196399 A | | 7/2000 |
| JP | 2001-127586 A | | 5/2001 |
| JP | 2001-156577 A | | 6/2001 |
| JP | 2001-285012 A | | 10/2001 |
| JP | 2004-266826 A | | 9/2004 |
| JP | 2004-343259 A | | 12/2004 |
| JP | 2005-198020 | * | 7/2005 |

OTHER PUBLICATIONS

B. Wall et al.; "Balanced Driven Transversely Coupled Waveguide Resonator Filters"; 1996 IEEE Ultrasonics Symposium Proceedings; vol. 1, pp. 47-51, San Antonio, TX, Nov. 3-6, 1996.*

* cited by examiner

*Primary Examiner* — Barbara Summons
(74) *Attorney, Agent, or Firm* — Chen Yoshimura LLP

(57) ABSTRACT

An acoustic wave filter includes a piezoelectric substrate, an IDT (interdigital transducer) formed on the piezoelectric substrate, and reflectors located at both sides of the IDT and composed of electrode fingers, at least one of the electrode fingers of at least one of the reflectors including at least one gap within a propagation path of an acoustic wave.

16 Claims, 15 Drawing Sheets

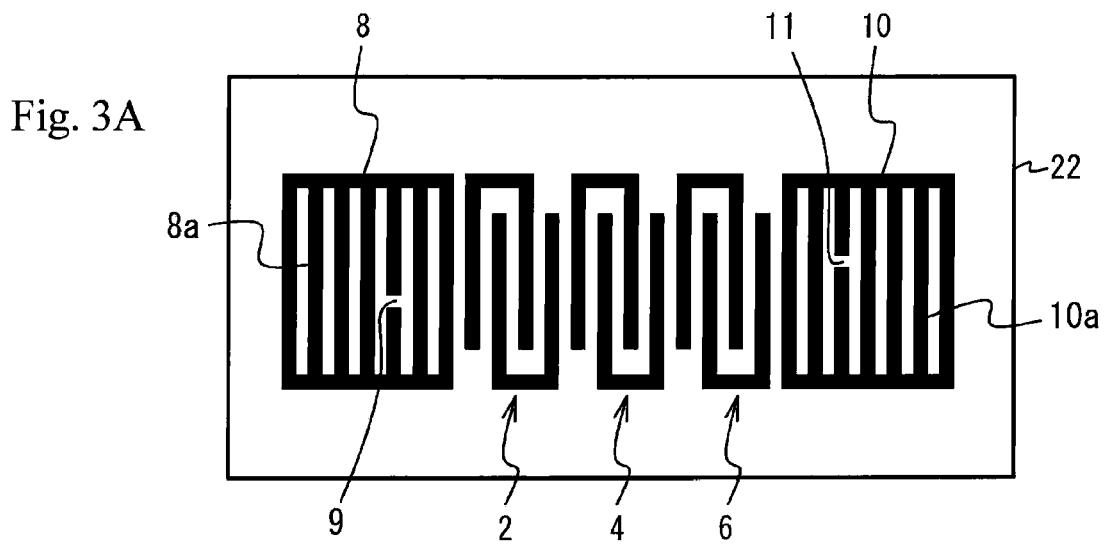
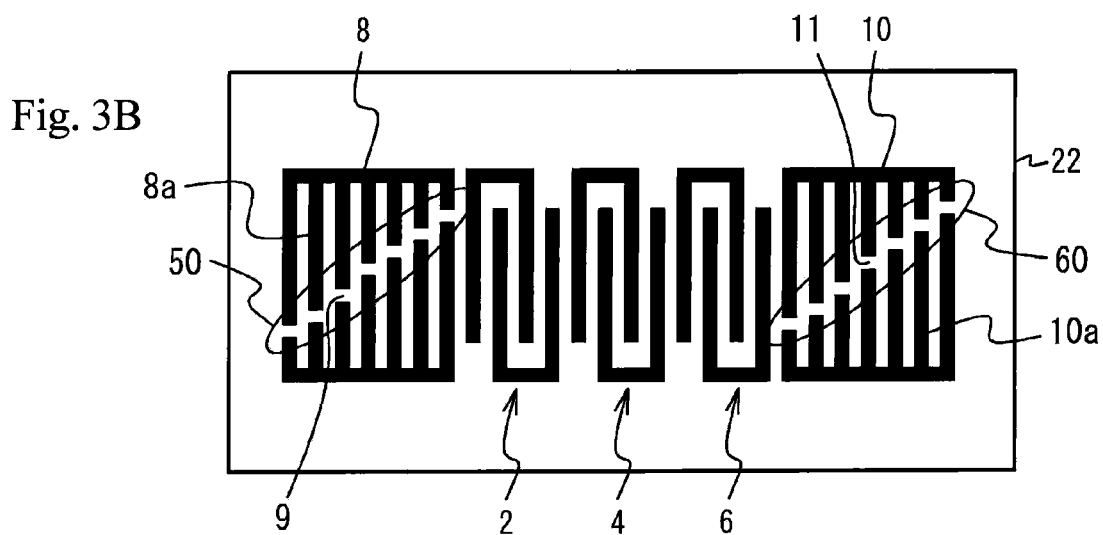
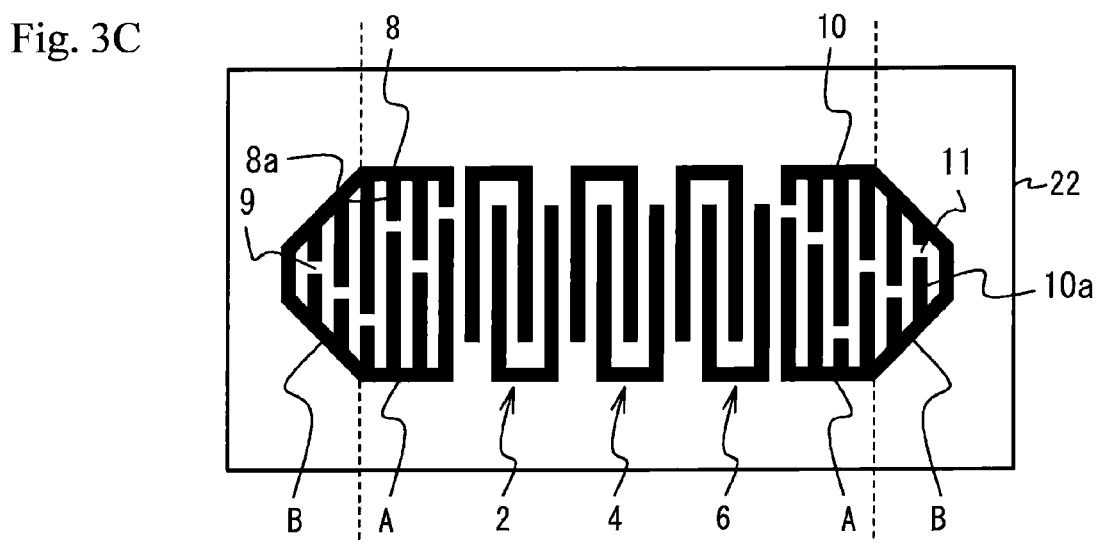

ACOUSTIC WAVE FILTER COMPRISING A REFLECTOR HAVING AN OBLIQUE SLIT

CROSS-REFERENCE TO RELATED APPLICATION

This application is based upon and claims the benefit of priority of the prior Japanese Patent Application No. 2008-059813, filed on Mar. 10, 2008, the entire contents of which are incorporated herein by reference.

FIELD

The present invention generally relates to acoustic wave filters, and more particularly, to an acoustic wave filter having a piezoelectric substrate on which an IDT (interdigital Transducer) and reflectors are formed.

BACKGROUND

There has been an increasing demand for downsizing, weight lighting and operable frequency raising in portable mobile communication devices due to advance of information-oriented society. A compact and light acoustic wave filter is used to meet the increasing demand. Particularly, an increasing number of portable phones adopt a system in which the transmission frequency and the reception frequency are close to each other. It is thus required to realize greater attenuation at frequencies close to the pass band.

An exemplary acoustic wave filter is a surface acoustic wave filter in which an IDT composed of comb electrodes and reflectors are provided on a piezoelectric substrate. Power is applied to a SAW element and an acoustic wave is thus excited. The SAW filter is capable of processing a radio signal in the range of 45 MHz to 2.0 GHz. The SAW filter is used to form a transmission bandpass filter or a reception bandpass filter.

FIG. 1A is a plan view of a conventional double-mode SAW filter, and FIG. 1B is a plan view of a double-mode SAW filter described in Japanese Laid-Open Patent Publication No. 2000-196399. As illustrated in FIG. 1A, three IDTs 2, 4 and 6 are formed on a piezoelectric substrate 22, which may be made of, for example, lithium niobate (LiNbO₃) or lithium tantalate (LiTaO₃). Reflectors 8 and 10 are interposed at both sides of an alignment of the IDTs 2, 4 and 6 in the direction of SAW propagation. The IDTs 2, 4 and 6 and the reflectors 8 and 10 are made of a metal such as aluminum (Al). An intentionally reduced number of electrodes fingers is illustrated in FIGS. 1A and 1B for the sake of simplicity.

When an electric signal is applied to the double-mode SAW filter, the acoustic waves are excited by the IDTs and are propagated in a direction perpendicular to the direction in which the electrode fingers extend. The acoustic waves are converted into electric signals of frequencies of the acoustic waves. The reflectors 8 and 10 function to confine the acoustic waves propagated from the IDTs 2, 4 and 6 by utilizing reflection, so that the acoustic waves can be suppressed from being attenuated. Actually, the reflectors 8 and 10 reflect acoustic waves (spurious waves) outside of the pass band. The spurious waves are superimposed and degrade the out-of-band attenuation of the double-mode SAW filter.

As illustrated in FIG. 1B, the above-mentioned publication shows a double-mode SAW filter in which the electrode fingers of the reflectors 8 and 10 become shorter in a reflection attenuating region B as the electrode fingers are farther away from the IDTs. The reflection attenuating region B has reflectivity different from that of a reflection region A in which the electrode fingers of the reflectors 8 and 10 have an equal length. This difference causes random reflection, which cancels the spurious waves and increases the amount of attenuation at a low-frequency side of the pass band and close thereto.

SUMMARY

According to an aspect of the present invention, there is provided an acoustic wave filter including: a piezoelectric substrate; an IDT (interdigital transducer) formed on the piezoelectric substrate; and reflectors located at both sides of the IDT and composed of electrode fingers, at least one of the electrode fingers of at least one of the reflectors including at least one gap within a propagation path of an acoustic wave.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A, 3B and 3C schematically illustrate variations of the first embodiment;

DESCRIPTION OF EMBODIMENTS

First Embodiment

Figure 1A:
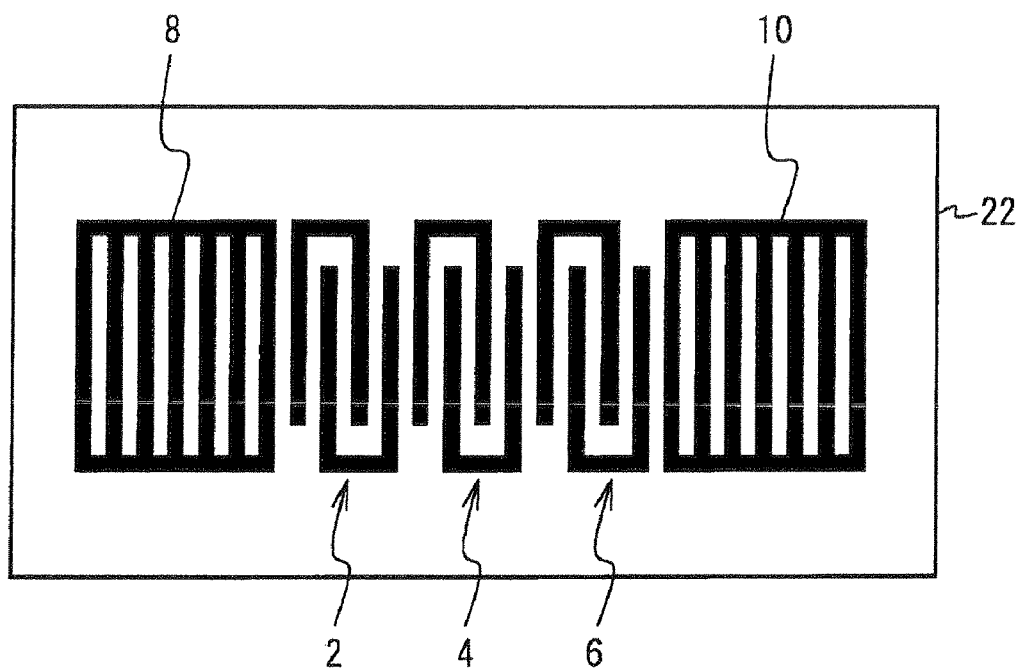
FIGS. 1A and 1B schematically illustrate conventional double-mode SAW filters.
Figure 1B:
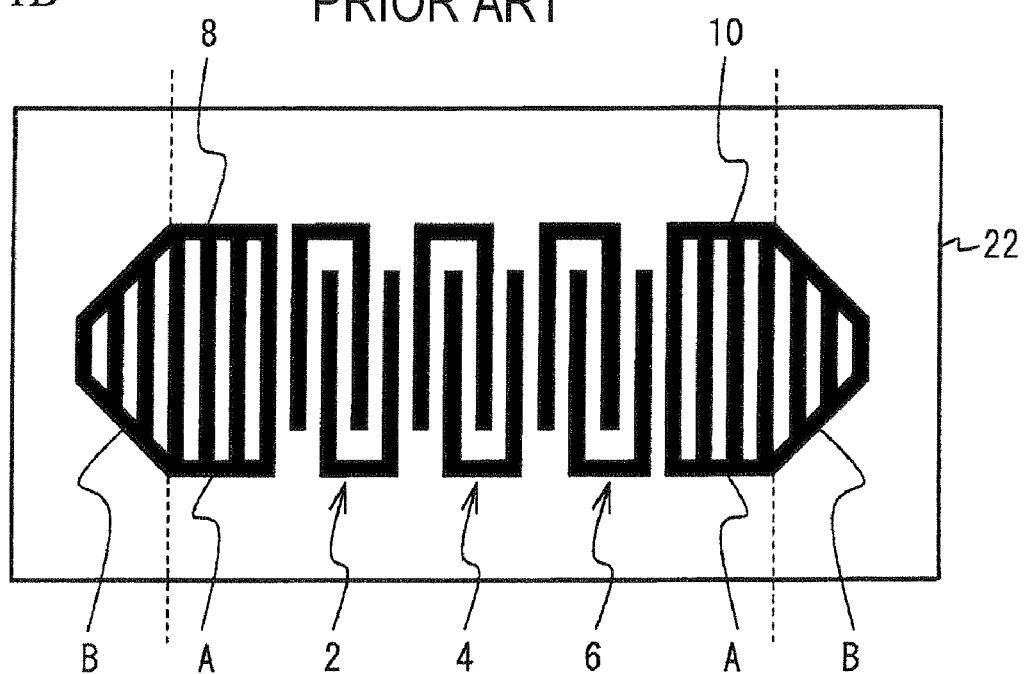
Figure 2:
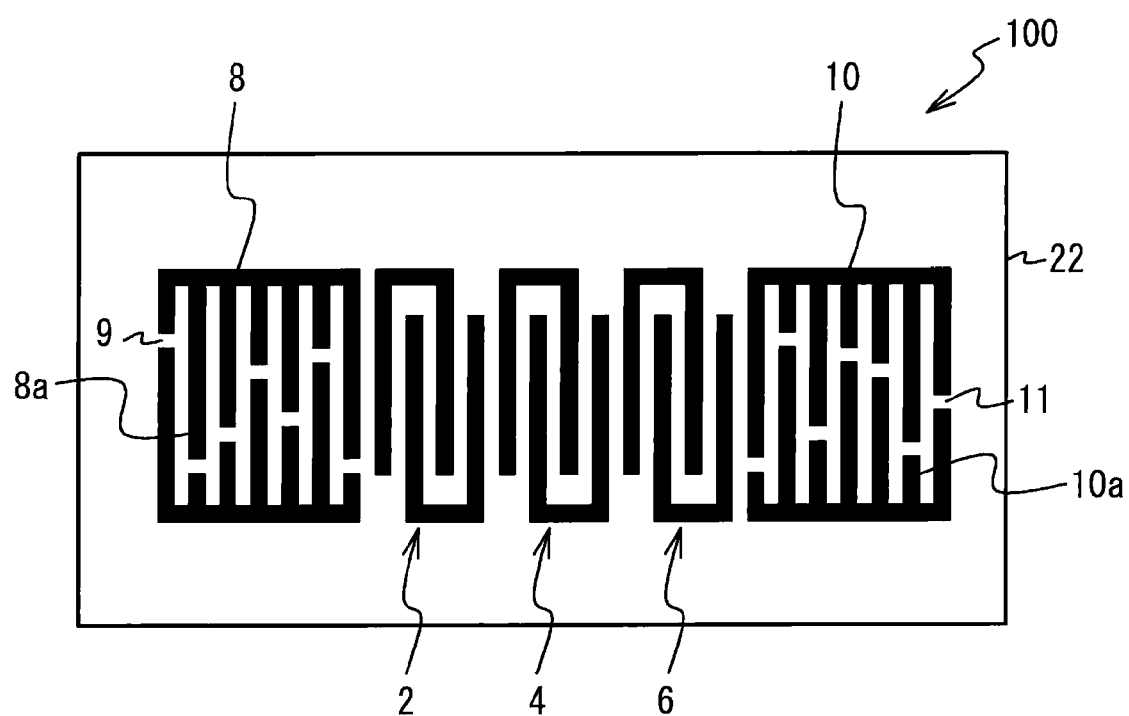
FIG. 2 schematically illustrates a double-mode SAW filter in accordance with a first embodiment.

FIGS. 2 through 3C schematically illustrate double-mode SAW filters 100 in accordance with a first embodiment.

Referring to FIG. 2, each of multiple electrode fingers 8a of the reflector 8 has a single gap 9, and each of multiple electrode fingers 10a of the reflector 10 has a single gap 11. The gaps 9 and 11 are located within a propagation path of acoustic waves in which the interleaving electrode fingers of IDT laterally overlap with each other. The gaps 9 and 11 do not reflect the acoustic waves, and change the reflectivities of the reflectors 8 and 10. Thus, reflection of the acoustic waves takes place at random, and the spurious waves from the reflector 8 and those from the reflector 10 are canceled, so that the amount of attenuation at the low-frequency side of the pass band and close thereto can be increased.

FIGS. 3A through 3C schematically illustrate variations of the configuration illustrated in FIG. 2 in accordance with the first embodiment.

FIG. 3A illustrates an exemplary configuration in which only one of the multiple electrode fingers 8a of the reflector 8 has one gap 9, and only one of the multiple electrode fingers 10a of the reflector 10 has one gap 11.

FIG. 3B illustrates another exemplary configuration in which gaps of each of the reflectors 8 and 10 are arranged in an oblique line so as to form a slit. More particularly, the reflector 8 has the gaps 9 formed in the electrode fingers 8a so as to form an oblique slit 50, and the reflector 10 has the gaps 11 formed in the electrode fingers 10a so as to form an oblique slit 60. If the slits 50 and 60 extend in parallel with the direction of SAW propagation (perpendicular to the direction in which the electrode fingers extend), the acoustic waves reflected by the electrode fingers are identical. This results in enlarged spurious waves. It can be seen from the above that the slits 50 and 60 are preferably formed obliquely to the direction of SAW propagation to cause random reflection and obtain increased attenuation. If the slits 50 and 60 are mirror symmetrical with each other about the direction perpendicular to the direction of SAW propagation, the reflection by the reflector 8 and that by the reflector 10 are the same as each other, and the spurious waves are increased. In order to cause random reflection, it is preferable that the slits 50 and 60 are not mirror symmetrical with each other about the direction perpendicular to the direction of SAW propagation. In the case where the slits 50 and 60 are mirror symmetrical with each other, if the reflectors 8 and 10 have different electrode pitches, the spurious waves will be reduced. In order to cause random reflection more effectively, it is preferable that the slits 50 and 60 are not parallel to each other, but cross the direction of SAW propagation at different angles.

FIG. 3C illustrates a further exemplary configuration in which the reflectors 8 and 10 have reflection attenuating regions B in which the electrode fingers 8a and 10a of the reflectors 8 and 10 become shorter as the electrode fingers 8a and 10a are farther away from the IDTs. Reflection that takes place in the reflection regions A in which the electrode fingers 8a and 10a have equal lengths is different from reflection that takes place in the reflection attenuating regions B. Thus, random reflection can be caused more effectively, so that improvements in cancellation of spurious waves and attenuation can be realized, as compared to the configuration illustrated in FIG. 2.

It is possible to vary the configuration depicted in FIG. 3A in which only one of the electrode fingers 8a of the reflector 8 has one gap 9 and only one of the electrode fingers 10a of the reflector 10 has one gap 11. For example, either one of the reflectors 8 and 10 may have one gap in one of the electrode fingers 8a or 10a within the propagation path of SAW. It is also possible to vary the configuration depicted in FIG. 3B in which the reflectors 8 and 10 have the slits 50 and 60, respectively. For example, either the reflector 8 or 10 may have the slit 50 or 60.

Second Embodiment

Figure 4:
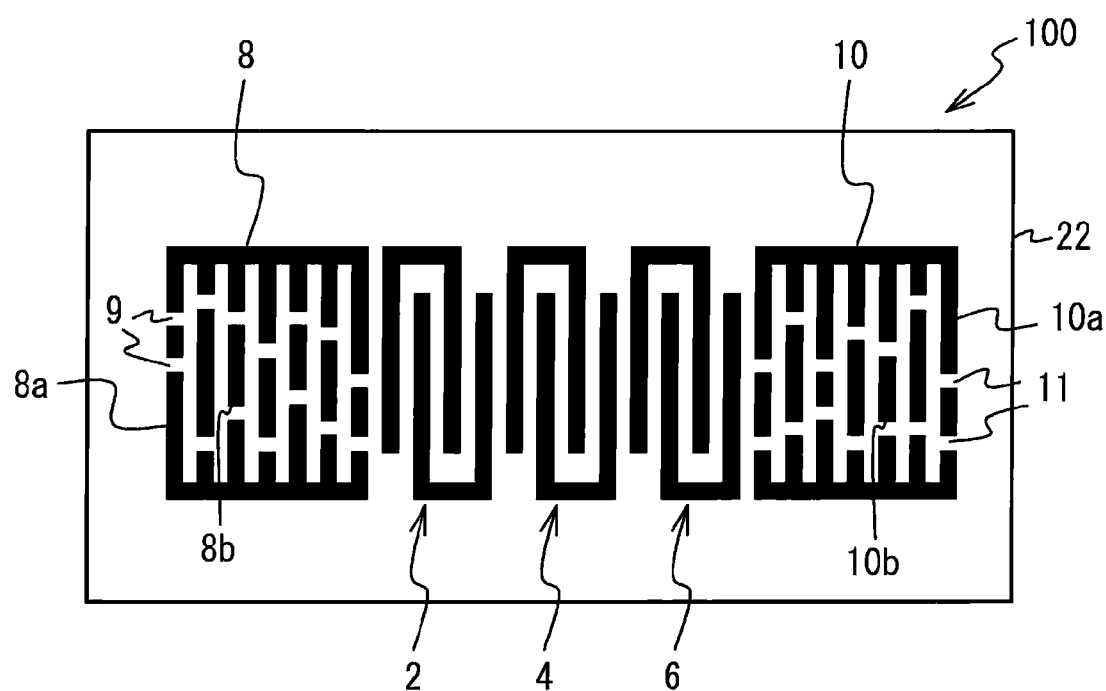
FIG. 4 schematically illustrates a double-mode SAW filter in accordance with a second embodiment.

A second embodiment has an exemplary configuration in which the reflectors 8 and 10 have electrode fingers each having multiple gaps. FIG. 4 illustrates a double-mode SAW filter 100 in accordance with the second embodiment.

Referring to FIG. 4, each of the electrode fingers 8a of the reflector 8 has two gaps 9, and each of the electrode fingers 10a of the reflector 10 has two gaps 11. Thus, the electrode fingers 8a have open portions or regions 8b and the electrode fingers 10a have open portions or regions 10b. Since the reflectors 8 and 10 are grounded, the open finger portions 8b and 10b have potentials different from the ground potential. Thus, the reflectivities of the reflectors 8 and 10 can be changed, and random reflection can be caused more effectively than that caused in the first embodiment. It is thus possible to further increase the attenuation at the low-frequency side of the pass band and close thereto.

Figure 5A:
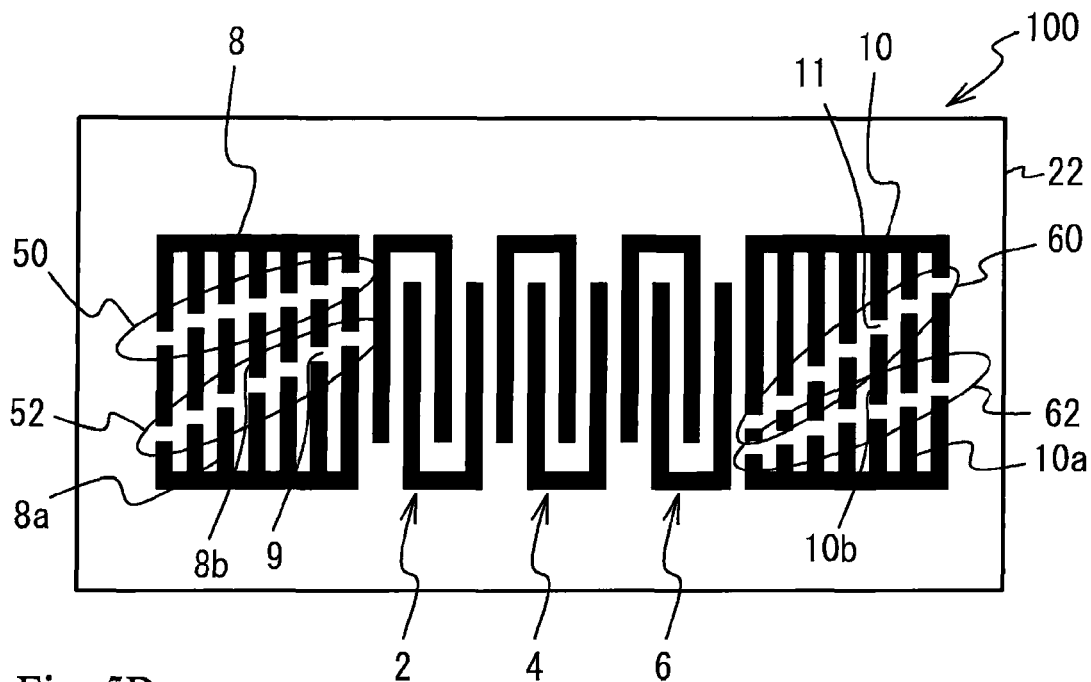
FIGS. 5A and 5B schematically illustrate variations of the second embodiment.
Figure 5B:
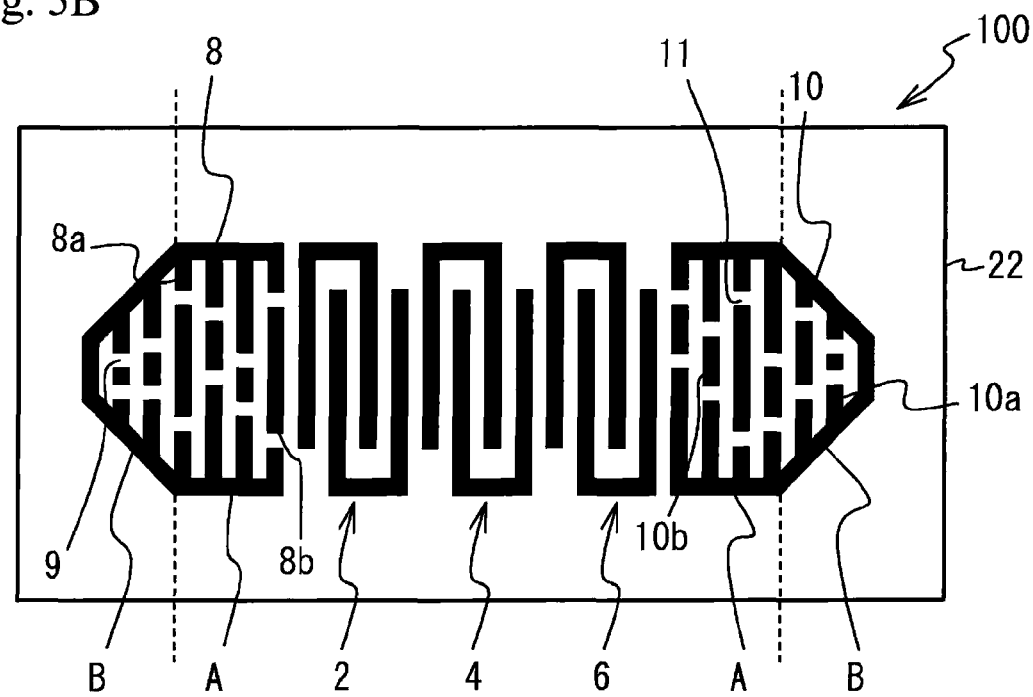

FIGS. 5A and 5B schematically depict variations of the second embodiment.

FIG. 5A illustrates an exemplary configuration in which the reflector 8 has two slits 50 and 52 and the reflector 10 has two slits 60 and 62. The reflector 8 has the open finger portions 8b, and the reflector 10 has the open finger portions 10b. Preferably, the slits 50 and 52 are not parallel to each other in order to cause random reflection more effectively. In this case, the slits 50 and 52 cross the direction of SAW propagation at different angles. The slits 60 and 62 are similarly arranged.

FIG. 5B illustrates an exemplary configuration in which the reflectors 8 and 10 have the reflection attenuating regions B in which the electrode fingers 8a and 10a become shorter as the electrode fingers 8a and 10a are farther away from the IDTs. The reflection from the reflection regions A and that from the reflection attenuating regions B are different from each other. Thus, improvements in cancellation of spurious waves and attenuation can be realized, as compared to the configuration illustrated in FIG. 4.

FIGS. 4 through 5B illustrate the configurations in which each of the electrode fingers 8a has two gaps and each of the electrode fingers 10a has two gaps. Each of the electrode fingers may have three or more gaps. Each of the reflectors 8 and 10 has three or more slits. The configuration illustrated in FIG. 4 may be varied so that either the electrode fingers 8a or the electrode fingers 10a have multiple gaps, or may be varied so that either the reflector 8 or the reflector 10 has multiple slits.

Third Embodiment

A third embodiment has an exemplary configuration in which two double-mode SAW filters are connected.

Figure 6:
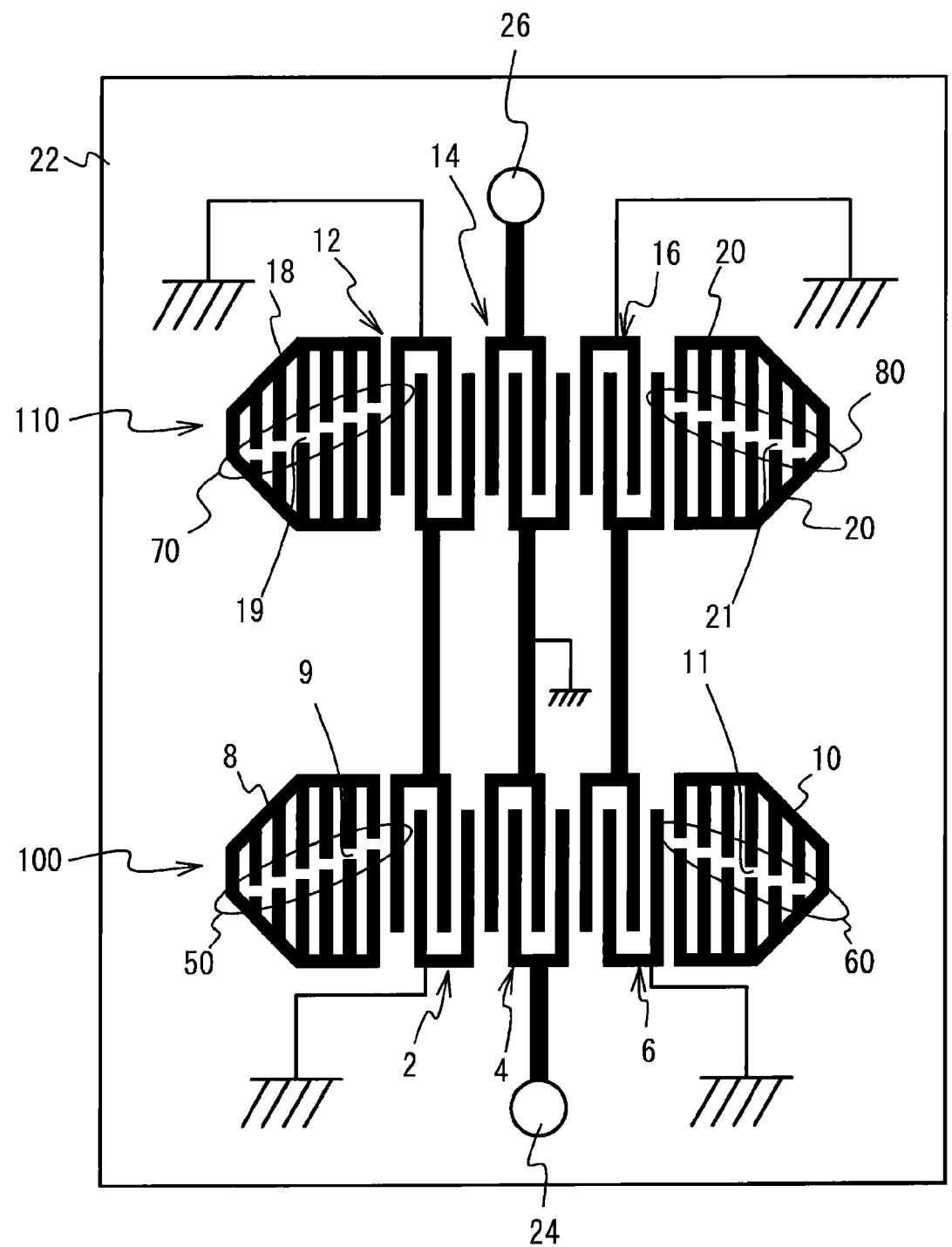
FIG. 6 schematically illustrates an exemplary connection of double-mode SAW filters of the third embodiment.

FIG. 6 schematically illustrates a SAW filter in which the double-mode SAW filter 100 and another double-mode SAW filter 110 similar to the filter 100 are cascaded. The double-mode SAW filter 110 is composed of IDTs 12, 14 and 16, and reflectors 18 and 20. A terminal 24 is connected to the IDT 4 located at the center of the double-mode SAW filter 100, and a terminal 26 is connected to the IDT 14 located at the center of the double-mode SAW filter 110. One of the terminals 24 and 26 is an input terminal and the other is an output terminal. The IDT 2 and the IDT 12 are connected, and the IDT 4 and the IDT 14 are connected. Similarly, the IDT 6 and the IDT 16 are connected.

Figure 7:
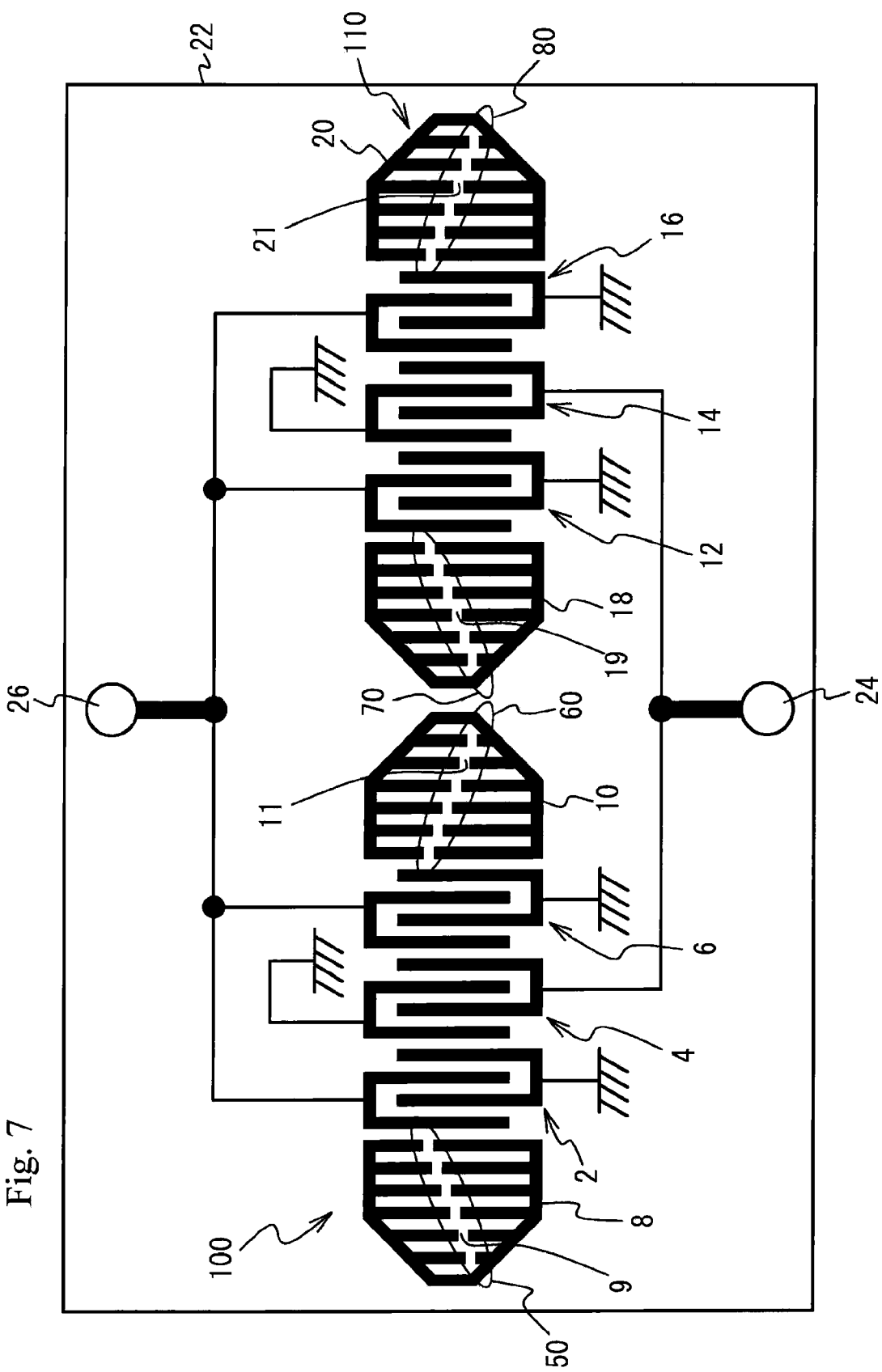
FIG. 7 schematically illustrates an exemplary connection of double-mode SAW filters in accordance with a variation of the third embodiment.

FIG. 7 illustrates a variation of the third embodiment in which the double-mode SAW filters 100 and 110 are connected in parallel. The IDTs 4 and 14 are connected to the terminal 24, and the IDTs 2, 6, 12 and 16 are connected to the terminal 26.

In the configurations shown in FIGS. 6 and 7, the reflectors 8, 10, 18 and 20 have the slits 50, 60, 70 and 80, respectively. Thus, the exited acoustic waves are reflected by the reflectors 8 and 10 at random, and the double-mode SAW filter 100 outputs an electric signal that is greatly attenuated at the low-frequency side of the pass band and close thereto. Similarly, the double-mode SAW filter 110 outputs an electric signal that is greatly attenuated at the low-frequency side of the pass band and close thereto.

The third embodiment having the reflectors each having one slit may be varied so that each reflector can be configured as in the case of the first or second embodiment.

Fourth Embodiment

A fourth embodiment is based on an experiment directed to computing the amount of attenuation while changing the number of gaps of a single double-mode SAW filter.

Figure 8:
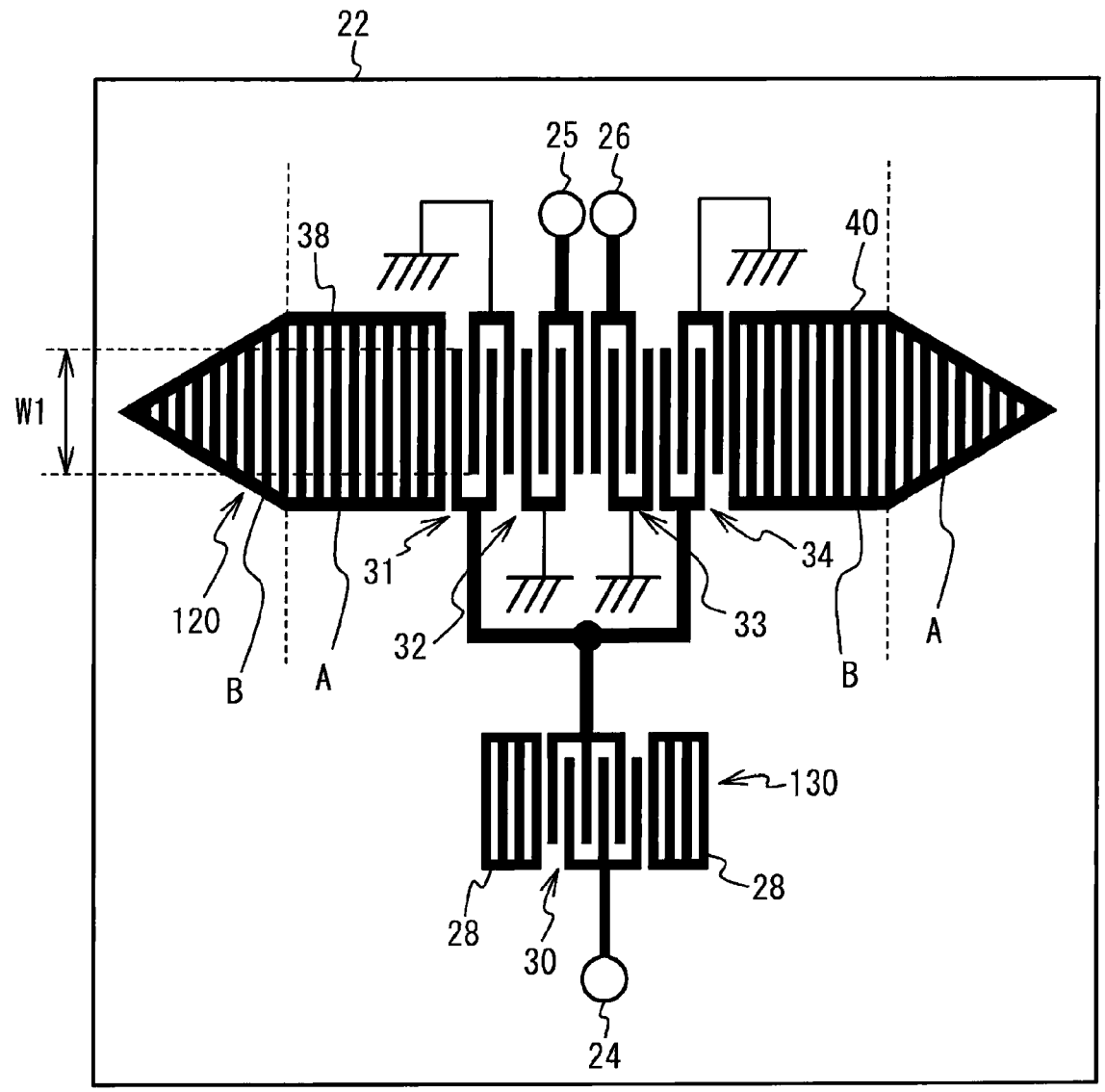
FIG. 8 schematically illustrates a SAW filter that is the base of a fourth embodiment.

FIG. 8 schematically illustrates a SAW filter that is the base of the fourth embodiment. It is assumed that the SAW filter illustrated in FIG. 8 is sample 1. As illustrated in FIG. 8, a double-mode filter SAW 120 and a resonator 130 are formed on the piezoelectric substrate 22. The double-mode SAW filter 120 is composed of IDTs 31, 32, 33 and 34, and reflectors 38 and 40. The resonator 130 is composed of an IDT 30 and two reflectors 28 provided at both sides of the IDT 30. An electric signal is applied to the IDT 30 via the input terminal 24, and is output to the IDTs 31 and 34. Acoustic waves are excited at the IDTs 31 and 34, and are converted into electric signals by the IDTs 32 and 33. Finally, electric signals are output via output terminals 25 and 26 respectively connected to the IDTs 32 and 33. The output terminals 25 and 26 are balanced output terminals via which the electric signals having a 180-degree phase difference can be obtained.

Each of the reflectors 38 and 40 has the reflection attenuating regions B. In each of the reflectors 38 and 40, the reflection region A has 20 electrode fingers, and the reflection attenuating region B has 18 electrode fingers. The aperture length W1 of the electrode fingers of IDTs 31, 32, 33 and 34, that is, the width of the SAW propagation path is 158 μm.

Figure 9A:
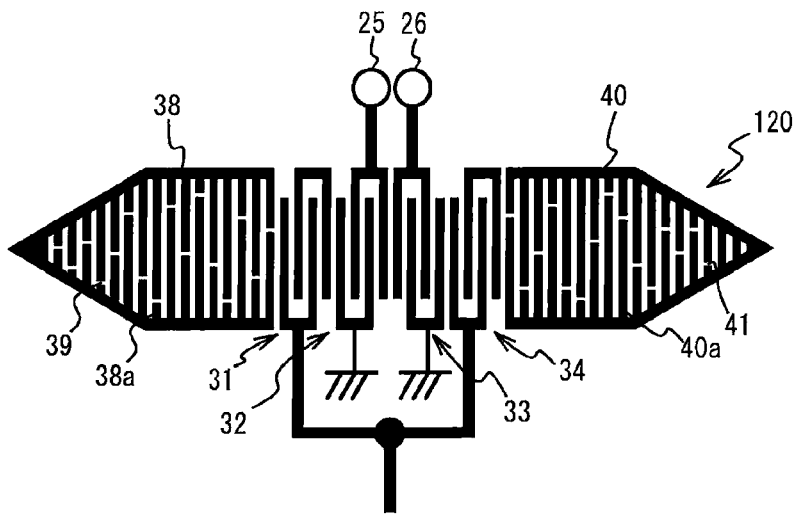
FIG. 9A schematically illustrates a double-mode SAW filter in accordance with sample 2 of the fourth embodiment.

FIG. 9A schematically depicts a double-mode SAW filter in which each of electrode fingers 38a of the reflector 38 has one gap 39, and each of electrode fingers 40a of the reflector 40 has one gap 41. Sample 2 of the fourth embodiment is defined so that the double-mode SAW filter 120 illustrated in FIG. 8 is replaced with the double-mode SAW filter 120 shown in FIG. 9A. The widths of the gaps 39 and 41 are 2 μm.

Figure 9B:
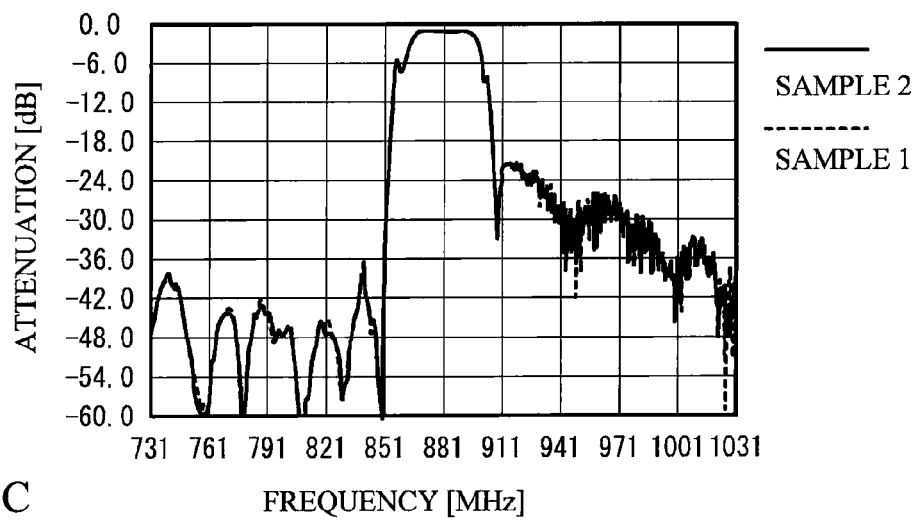
FIGS. 9B and 9C illustrate results of computer simulation.
Figure 9C:
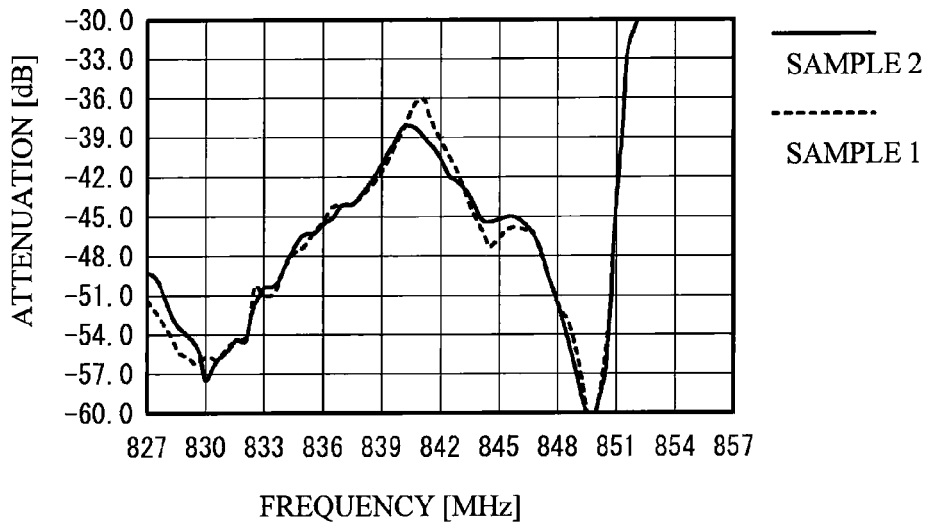

FIG. 9B depicts frequency characteristics of samples 1 and 2 obtained by computer simulation. FIG. 9C is an enlarged view of a frequency characteristic close to and located at the low-frequency side of the pass band. The horizontal axes of FIGS. 9B and 9C denote the frequency (MHz), and the vertical axes denote the attenuation (dB). As depicted in FIG. 9C, sample 2 has an attenuated spike at about 840 MHz, which is approximately 2.0 dB greater than that of sample 1.

Figure 10A:
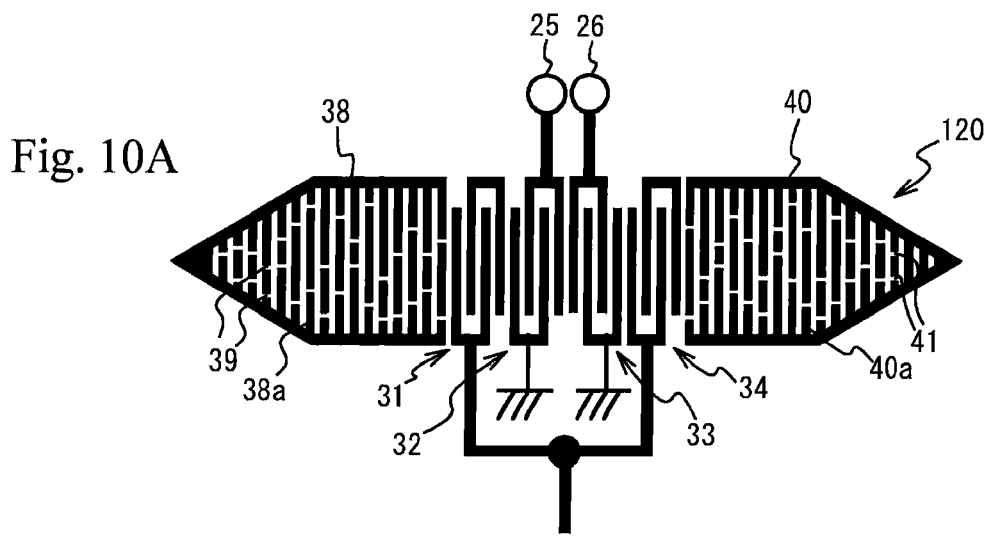
FIG. 10A schematically illustrates a double-mode SAW filter in accordance with sample 3 of the fourth embodiment.

FIG. 10A schematically illustrates another configuration of the double-mode SAW filter 120 in which each of the electrode fingers 38a of the reflector 38 has two gaps 39, and each of the electrode fingers 40a of the reflector 40 has two gaps 41. Sample 3 of the fourth embodiment is defined so that the double-mode SAW filter 120 depicted in FIG. 8 is replaced by the double-mode SAW filter 120 illustrated in FIG. 10A. The widths of the gaps 39 and 41 are 2 μm.

Figure 10B:
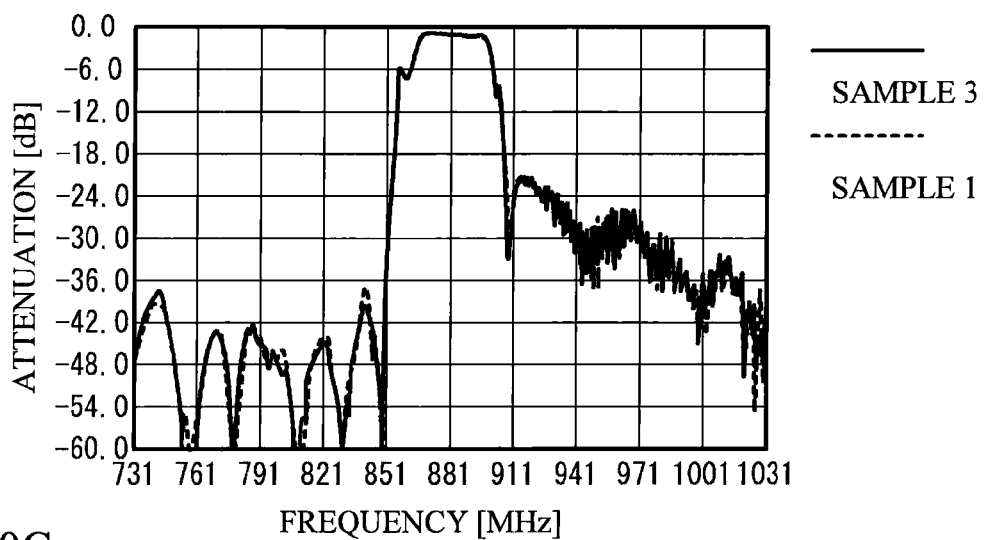
FIGS. 10B and 10C illustrate results of computer simulation.
Figure 10C:
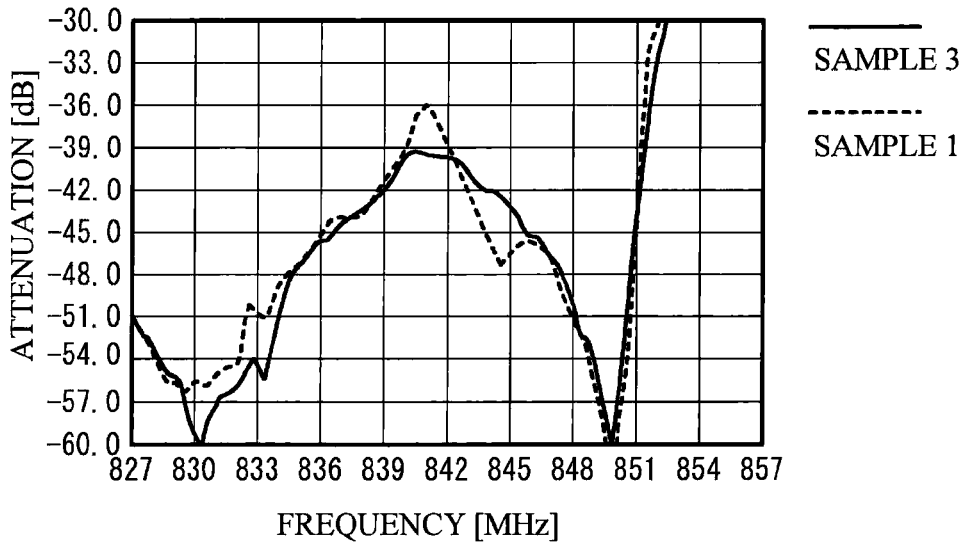

FIG. 10B depicts frequency characteristics of samples 1 and 3 obtained by computer simulation. FIG. 10C is an enlarged view of a frequency characteristic close to and located at the low-frequency side of the pass band. As depicted in FIG. 10C, sample 3 has an attenuated spike at about 840 MHz, which is approximately 3.0 dB smaller than that of sample 1. Further, the attenuations at 833 MHz and 830 MHz are approximately 4.0 dB greater than those in sample 1.

As described above, a large amount of attenuation can be obtained by forming one gap in each of the electrode fingers of the reflectors, as compared to the arrangement in which no gap is formed in each electrode finger. Further, the attenuation can be increased by forming two gaps in each of the electrode fingers of the reflectors.

Fifth Embodiment

A fifth embodiment is based on an experiment directed to computing the attenuation of double-mode SAW filters connected in parallel in which the electrode fingers of the reflectors have gaps, and to computing the attenuation of double-mode SAW filters connected in parallel in which the electrode fingers of the reflectors have no gaps.

Figure 11:
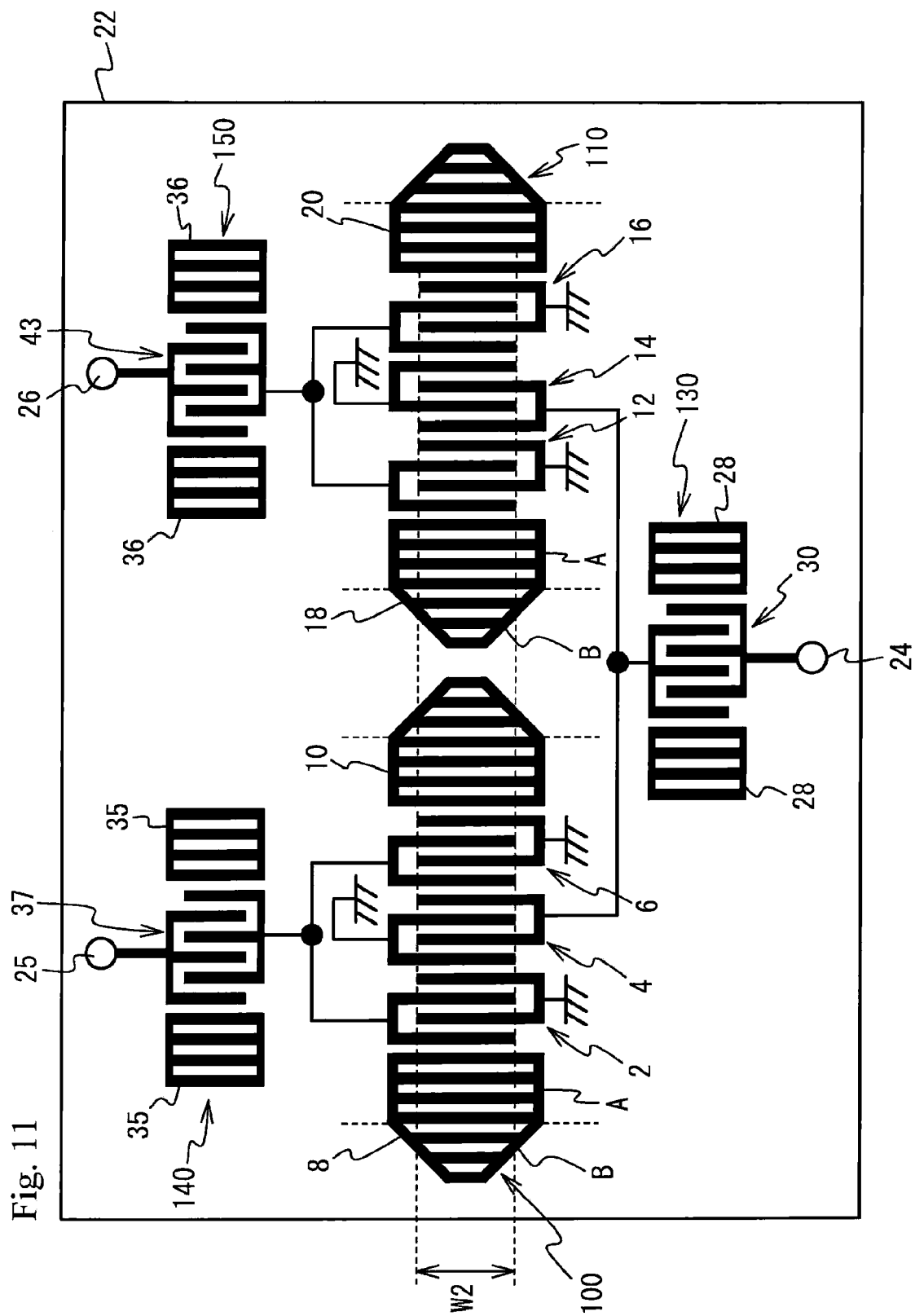
FIG. 11 schematically illustrates a SAW filter that is the base of a fifth embodiment.

FIG. 11 schematically illustrates a SAW filter that is the base of the fifth embodiment and is defined as sample 4. Referring to FIG. 11, two double-mode SAW filters 100 and 110 and resonators 130, 140 and 150 are provided on the piezoelectric substrate 22. The double-mode SAW filters 100 and 110 are connected in parallel with the resonator 130. The configurations of the double-mode SAW filters 100 and 110 and the resonator 130 have been described. The resonator 140 is composed of an IDT 37 and reflectors 35 provided at both sides of the IDT 37. Similarly, the resonator 150 is composed of an IDT 43 and reflectors 36 provided at both sides of the IDT 43. An electric signal applied to the IDT 30 via the input terminal 24 is output to the IDTs 4 and 14. The electric signal applied to the IDT 4 excites the acoustic wave. The acoustic wave thus excited is converted into electric signals by the IDTs 2 and 6, which are then output to the IDT 37. Finally, the electric signal is output via the output terminal 25. Similarly, the electric signal applied to the IDT 14 is output to the IDT 43 via the IDTs 12 and 16, and is finally output via the output terminal 26.

Each of the reflectors 8, 10, 18 and 20 has the reflection attenuating region B. In each of those reflectors, the reflection region A has 30 electrode fingers, and the reflection attenuating region B has 42 electrode fingers. The width W2 of the SAW propagation path is 83 μm.

Figure 12A:
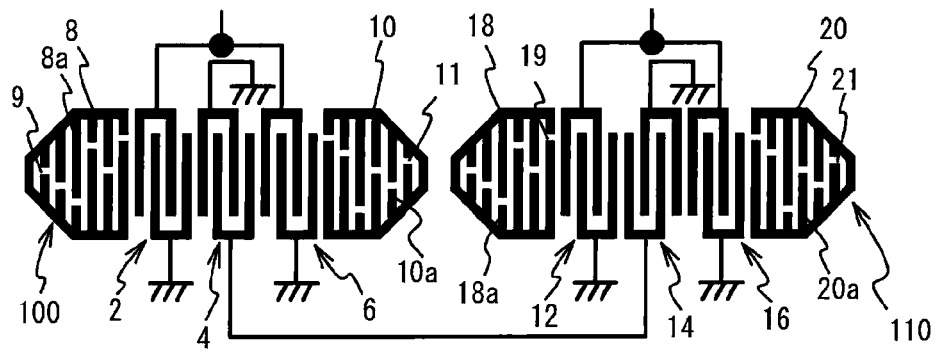
FIG. 12A schematically illustrates a double-mode SAW filter in accordance with sample 5 of a fifth embodiment.

FIG. 12A schematically illustrates the double-mode SAW filters 100 and 110 in which each electrode finger of each reflector has a single gap. Sample 5 of the fifth embodiment is defined so that the double-mode SAW filters 100 and 110 shown in FIG. 11 are replaced with the double-mode SAW filters 100 and 110 shown in FIG. 12A. The width of each gap is 2 μm.

Figure 12B:
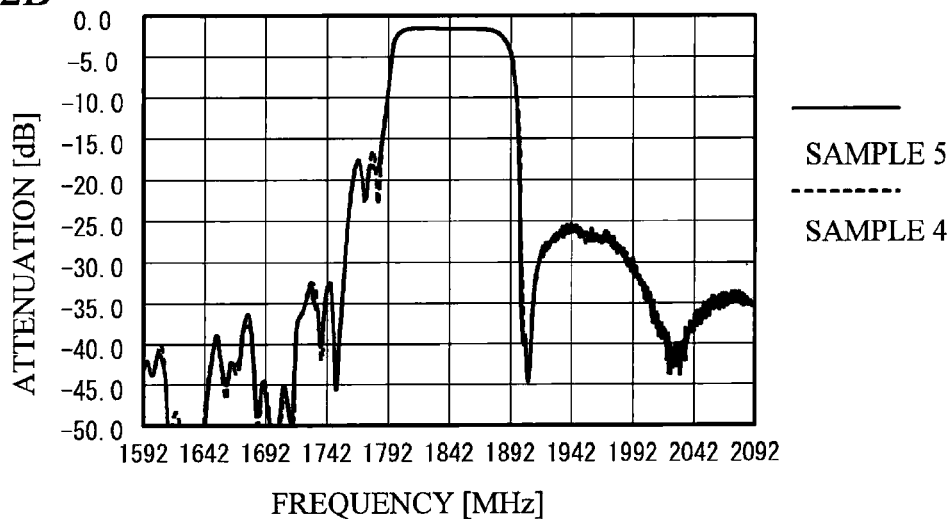
FIGS. 12B and 12C illustrate results of computer simulation.
Figure 12C:
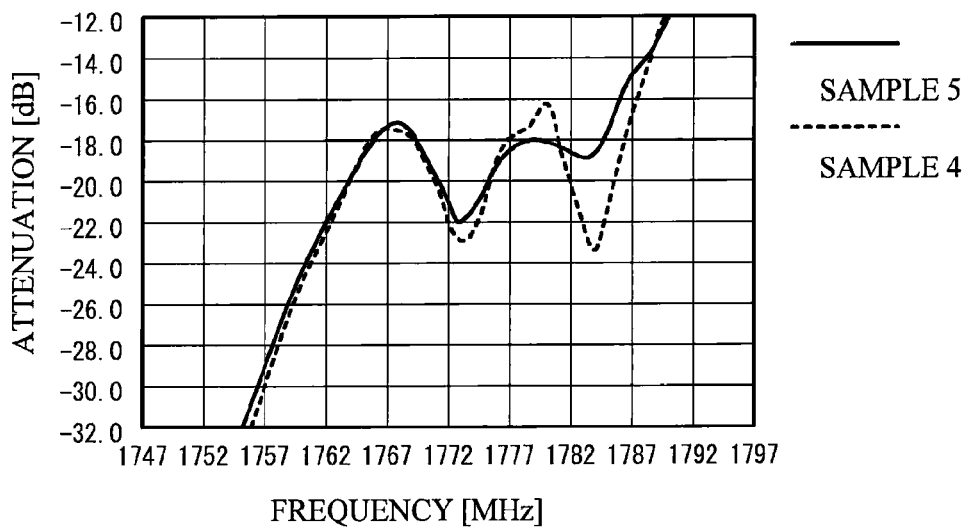

FIG. 12B depicts frequency characteristics of samples 4 and 5 obtained by computer simulation. FIG. 12C is an enlarged view of a frequency characteristic close to and located at the low-frequency side of the pass band. As depicted in FIG. 12C, sample 5 has an attenuated spike at about 1780 MHz, which is approximately 2.0 dB smaller than that of sample 4.

As described above, the gaps formed in the electrode fingers of the reflectors increase the amount of attenuation in the double-mode SAW filters connected in parallel.

Sixth Embodiment

A sixth embodiment is based on an experiment directed to computing the amount of attenuation while changing the number of slits in the reflectors.

Figure 13:
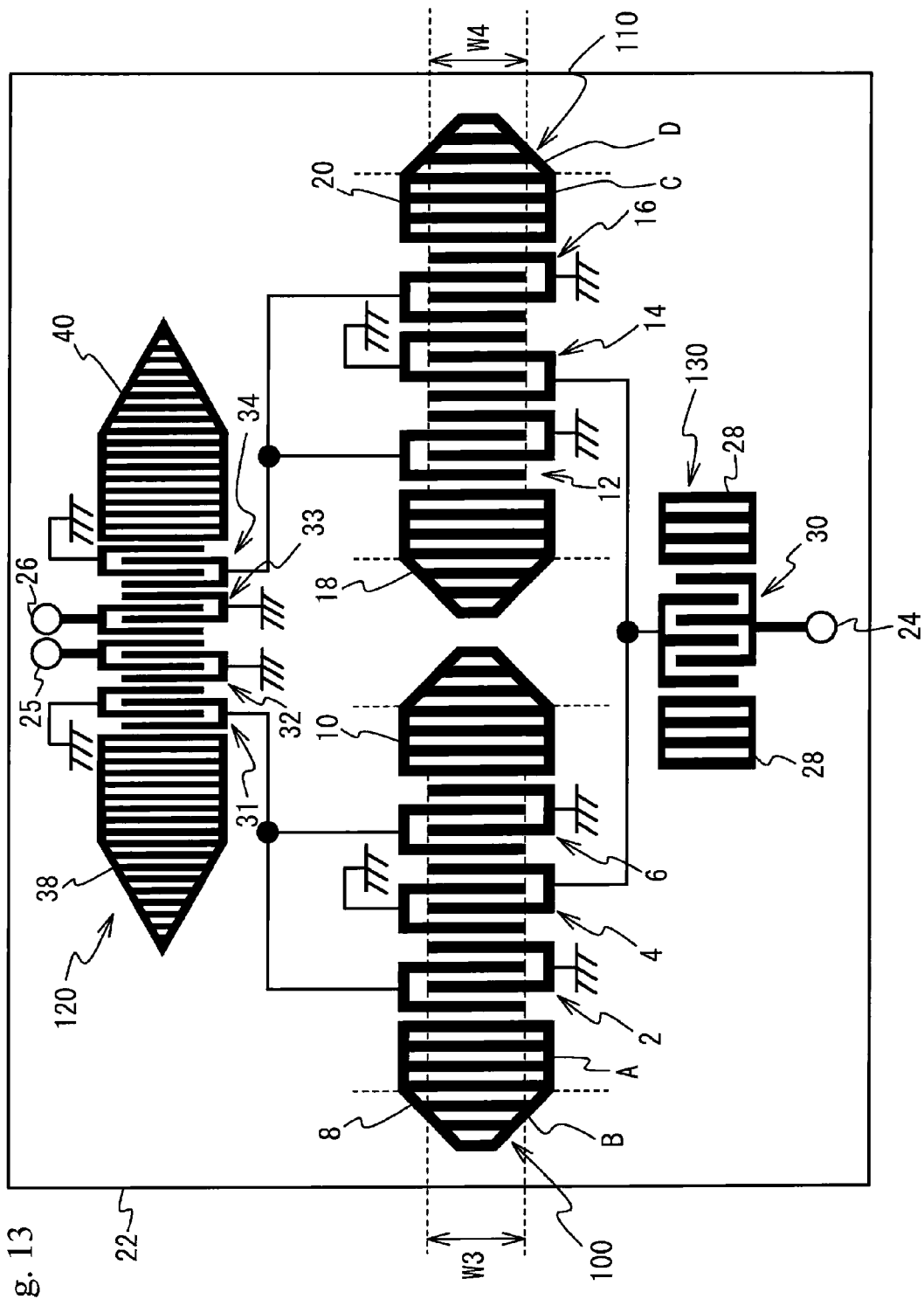
FIG. 13 schematically illustrates a SAW filter that is the base of a sixth embodiment.

FIG. 13 schematically illustrates a SAW filter that is the base of the sixth embodiment, which is defined as sample 6. Referring to FIG. 13, the double-mode SAW filters 100, 110 and 120 and the resonator 130, which have been described, are formed on the piezoelectric substrate 22. As in the case of FIG. 11, the double-mode SAW filters 100 and 110 are connected to the resonator 130 in parallel. The IDTs 2 and 6 of the double-mode SAW filter 100 are connected to the IDT 31 of the double-mode SAW filter 120, and the IDTs 12 and 16 of the double-mode SAW filter 110 are connected to the IDT 34 of the double-mode SAW filter 120.

Each of the reflectors 8 and 10 has the reflection attenuating region B. The reflection region A has 30 electrode fingers, and the reflection attenuating region B has 27 electrode fingers. Each of the reflectors 18 and 20 has a reflection attenuating region D. The reflection region C has 30 electrode fingers, and the reflection attenuating region D has 24 electrode fingers. The SAW propagation path in the double-mode SAW filter 100 has a width W3 of 56 μm, and the SAW propagation path in the double-mode SAW filter 110 has a width W4 of 18 μm.

Figure 14A:
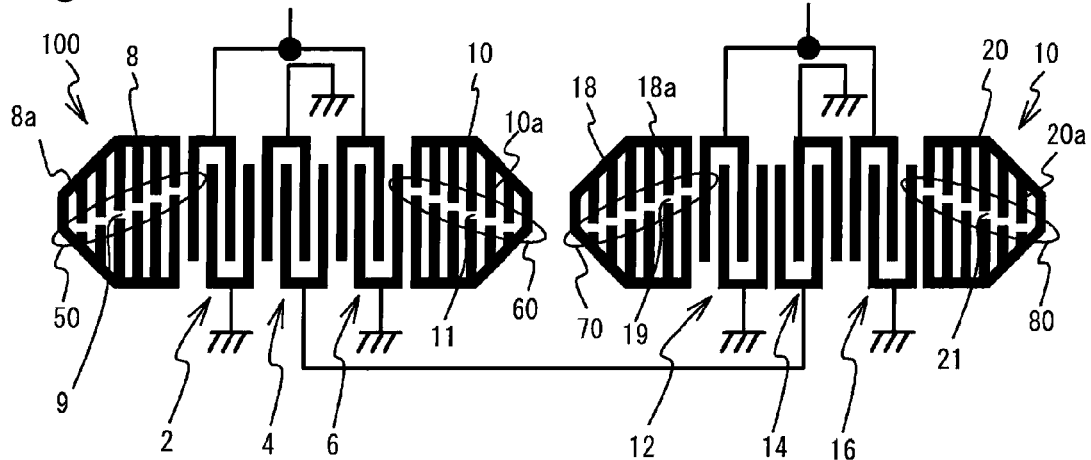
FIG. 14A schematically illustrates a double-mode SAW filter in accordance with sample 7 of a sixth embodiment.

FIG. 14A schematically depicts the double-mode SAW filters 100 and 110 in which each electrode finger of each reflector has one gap so as to form one slit in each reflector. Sample 7 of the sixth embodiment is defined so that the double-mode SAW filters 100 and 110 are placed with the double-mode SAW filters 100 and 110 shown in FIG. 14A. The width of each gap is 4 μm.

Figure 14B:
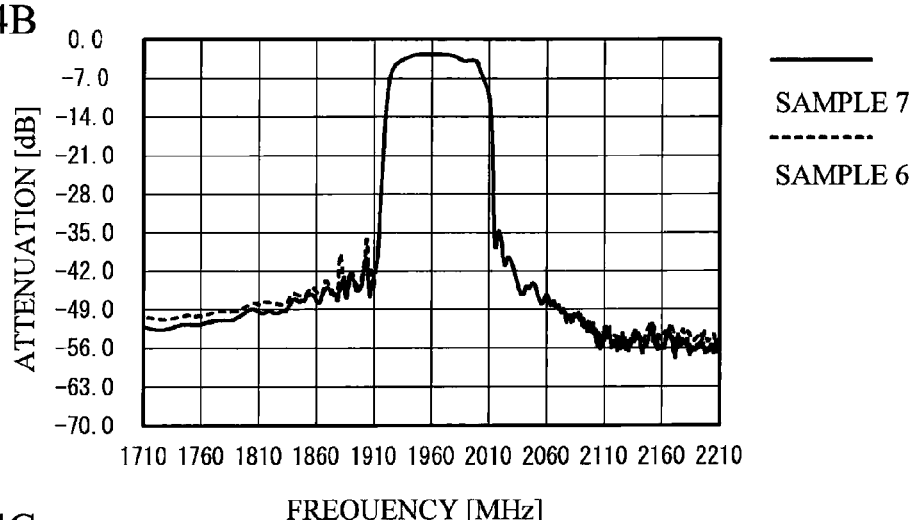
FIGS. 14B and 14C illustrate results of computer simulation.
Figure 14C:
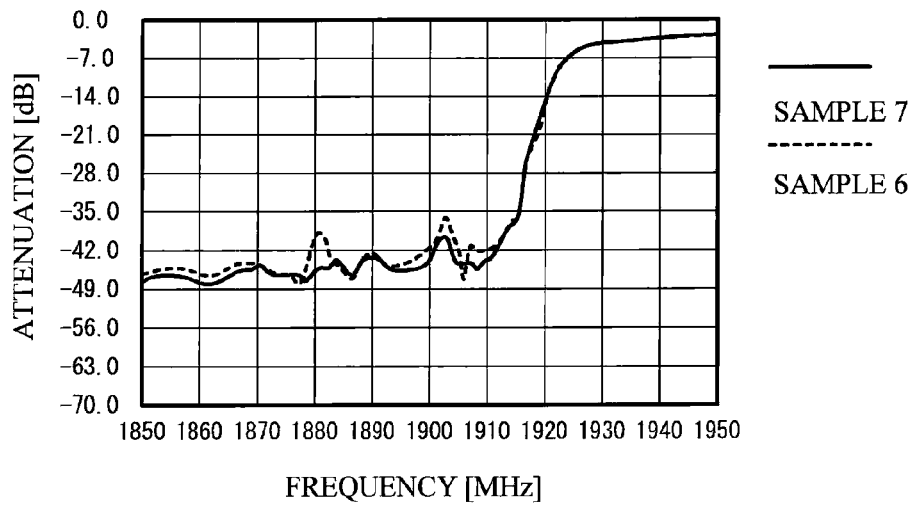

FIG. 14B depicts frequency characteristics of samples 6 and 7 obtained by computer simulation. FIG. 14C is an enlarged view of a frequency characteristic close to and located at the low-frequency side of the pass band. As depicted in FIG. 14C, sample 7 has an attenuated spike at about 1880 MHz, which is approximately 7.0 dB smaller than that of sample 6. Further, sample 7 has an attenuated spike at about 1900 MHz, which is approximately 4.0 dB smaller than that of sample 6.

Figure 15A:
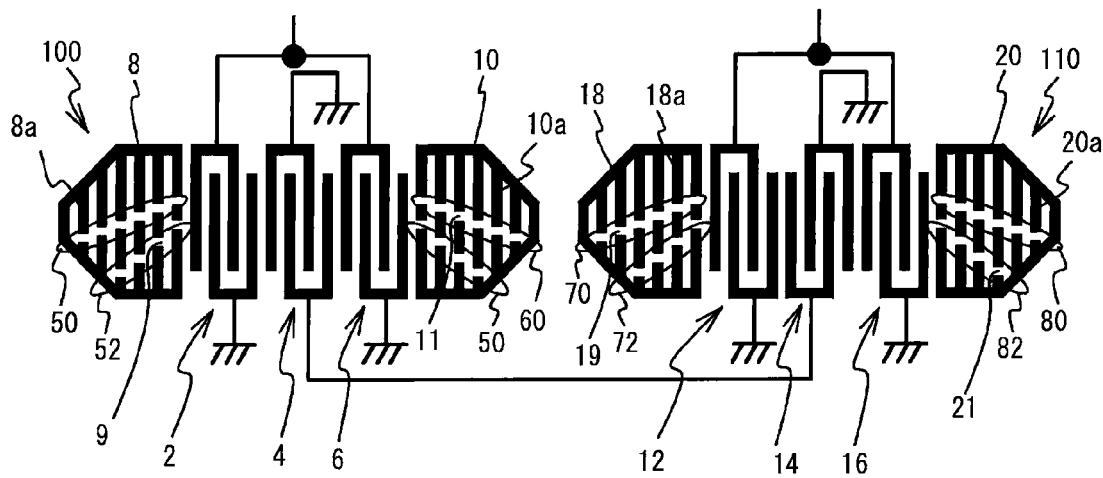
FIG. 15A schematically illustrates a double-mode SAW filter in accordance with sample 8 of a sixth embodiment.

FIG. 15A schematically depicts the double-mode SAW filters 100 and 110 in which each electrode finger of each reflector has two gaps so as to form two slits in each reflector. Sample 8 of the sixth embodiment is defined so that the double-mode SAW filters 100 and 110 shown in FIG. 13 are replaced with the double-mode SAW filters 100 and 110 shown in FIG. 15A.

Figure 15B:
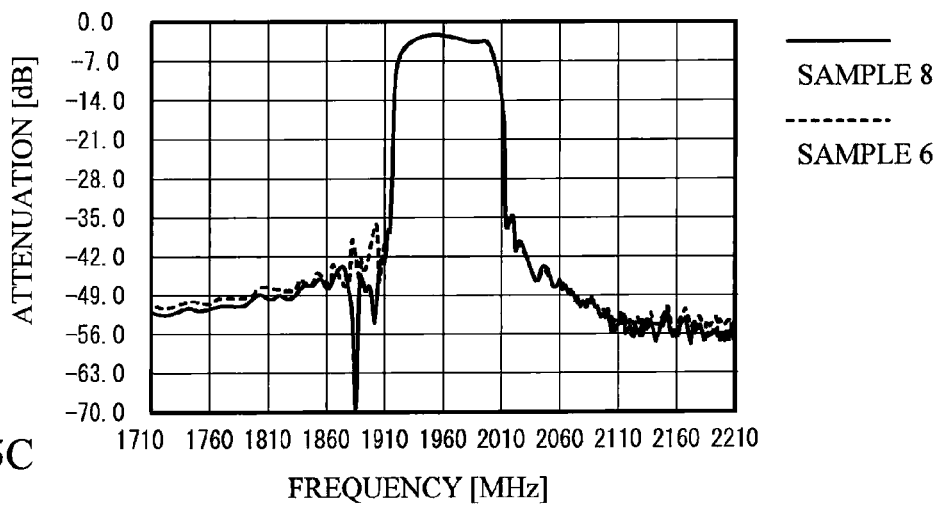
FIGS. 15B and 15C illustrate results of computer simulation.
Figure 15C:
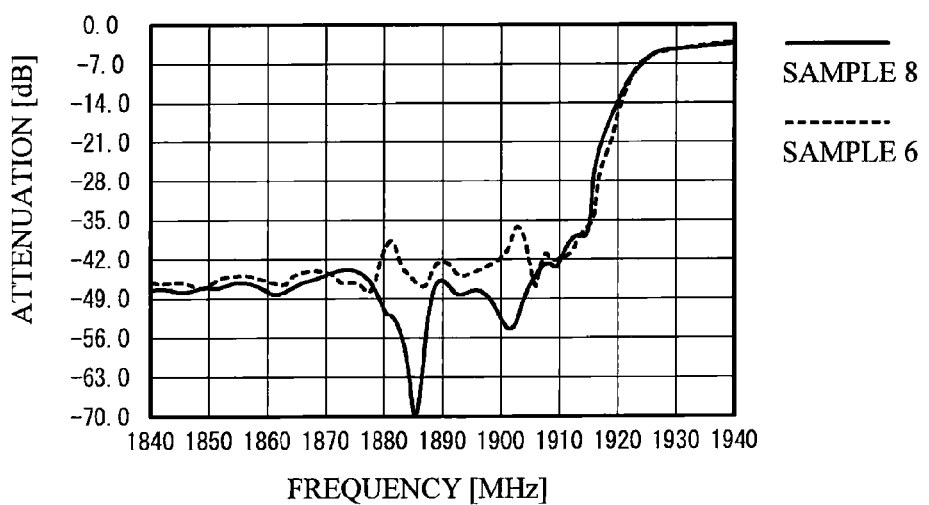

FIG. 15B depicts frequency characteristics of samples 6 and 8 obtained by computer simulation. FIG. 15C is an enlarged view of a frequency characteristic close to and located at the low-frequency side of the pass band. As depicted in FIG. 15C, sample 8 has an attenuated spike at about 1880 MHz, which is approximately 14.0 dB smaller than that of sample 6. Further, sample 8 has an attenuated spike at about 1885 MHz, which is approximately 25.0 dB smaller than that of sample 6, and has another attenuated spike at about 1900 MHz, which is approximately 18.0 dB smaller than that of sample 6.

As described above, one slit formed in each reflector increases the amount of attenuation. Two slits formed in each reflector further increase the amount of attenuation.

The first through sixth embodiments are the exemplary double-mode SAW filters. The present invention is not limited to these double-mode SAW filters but includes acoustic wave filters other than the double-mode SAW filters and boundary acoustic wave filters.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. An acoustic wave filter comprising:
   a piezoelectric substrate;
   an IDT (interdigital transducer) formed on the piezoelectric substrate; and
   reflectors located at both sides of the IDT and composed of electrode fingers,
   at least one of the electrode fingers of at least one of the reflectors including at least one gap within a propagation path of an acoustic wave,
   wherein the electrode fingers of the at least one of the reflectors have gaps so that the gaps of neighboring electrode fingers form an oblique slit with respect to a direction of propagation of the acoustic wave and the oblique slit is in at least a part of one of the reflectors.

2. The acoustic wave filter according to claim 1, wherein the at least one of the electrode fingers of the at least one of the reflectors includes multiple gaps within the propagation path of the acoustic wave.

3. The acoustic wave filter according to claim 1, wherein the electrode fingers of the reflectors are not connected in the path of the acoustic wave and have an open electrode.

4. The acoustic wave filter according to claim 1, wherein the electrode fingers of the at least one of the reflectors have gaps so as to form multiple oblique slits with respect to a direction of propagation of the acoustic wave.

5. The acoustic wave filter according to claim 4, wherein the oblique slits cross the direction of propagation of the acoustic wave at different angles.

6. The acoustic wave filter according to claim 1, wherein the electrode fingers of the reflectors include multiple gaps within the propagation path of the acoustic wave.

7. The acoustic wave filter according to claim 1, wherein the electrode fingers of the reflectors have gaps so as to form an oblique slit in each of the reflectors with respect to a direction of propagation of the acoustic wave.

8. The acoustic wave filter according to claim 7, wherein the oblique slits in the reflectors cross the direction of propagation of the acoustic wave at different angles.

9. The acoustic wave filter according to claim 1, wherein the electrode fingers of the reflectors have gaps so as to form oblique slits in each of the reflectors with respect to a direction of propagation of the acoustic wave.

10. The acoustic wave filter according to claim 9, wherein the oblique slits in the reflectors cross the direction of propagation of the acoustic wave at different angles.

11. The acoustic wave filter according to claim 1, wherein the electrode fingers become shorter as the electrode fingers are farther away from the IDT.

12. The acoustic wave filter according to claim 1, wherein the acoustic wave filter is a double-mode surface acoustic wave filter.

13. The acoustic wave filter according to claim 1, wherein the acoustic wave filter includes multiple double-mode acoustic wave filters cascaded.

14. The acoustic wave filter according to claim 1, wherein the acoustic wave filter includes multiple double-mode acoustic wave filters connected in parallel.

15. An acoustic wave filter, comprising:
a piezoelectric substrate;
an IDT (interdigital transducer) formed on the piezoelectric substrate; and
reflectors located at both sides of the IDT and composed of electrode fingers,
at least one of the electrode fingers of at least one of the reflectors including at least one gap within a propagation path of an acoustic wave,
wherein the electrode fingers of the reflectors have gaps so as to form an oblique slit in each of the reflectors with respect to a direction of propagation of the acoustic wave, and
wherein the oblique slits in the reflectors are not mirror symmetrical with each other in a direction perpendicular to the direction of propagation of the acoustic wave.

16. An acoustic wave filter, comprising:
a piezoelectric substrate;
an IDT (interdigital transducer) formed on the piezoelectric substrate; and
reflectors located at both sides of the IDT and composed of electrode fingers,
at least one of the electrode fingers of at least one of the reflectors including at least one gap within a propagation path of an acoustic wave,
wherein the electrode fingers of the reflectors have gaps so as to form oblique slits in each of the reflectors with respect to a direction of propagation of the acoustic wave, and
wherein the oblique slits in the reflectors are not mirror symmetrical with each other in a direction perpendicular to the direction of propagation of the acoustic wave.

* * * * *